US012813136B2

(12) United States Patent
Kim et al.

(10) Patent No.: US 12,813,136 B2
(45) Date of Patent: Nov. 24, 2026

(54) DISPLAY DEVICE AND METHOD OF MANUFACTURING SAME

(71) Applicant: Samsung Display Co., Ltd., Yongin-si (KR)

(72) Inventors: Seunghun Kim, Yongin-si (KR); Woocheol Park, Yongin-si (KR); Heejun Yang, Yongin-si (KR); Kwanhyuck Yoon, Yongin-si (KR); Jeongseok Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 496 days.

(21) Appl. No.: 18/448,391

(22) Filed: Aug. 11, 2023

(65) Prior Publication Data

US 2024/0147816 A1 May 2, 2024

(30) Foreign Application Priority Data

Nov. 1, 2022 (KR) ........................ 10-2022-0143943

(51) Int. Cl.
*H10K 59/80* (2023.01)
*H10K 59/12* (2023.01)

(52) U.S. Cl.
CPC ....... *H10K 59/873* (2023.02); *H10K 59/1201* (2023.02); *H10K 59/879* (2023.02)

(58) Field of Classification Search
CPC ............ H10K 59/873; H10K 59/1201; H10K 59/879; H10K 59/876; H10K 59/12; H10K 50/852; H10K 50/11; H10K 50/81; H10K 50/82; H10K 50/844; H10K 59/122; H10K 71/00
See application file for complete search history.

(56) References Cited

U.S. PATENT DOCUMENTS

| | | | |
|---|---|---|---|
| 8,435,650 | B2 | 5/2013 | Mehrtens et al. |
| 9,431,634 | B2 | 8/2016 | Song |
| 9,506,146 | B2 | 11/2016 | Cho et al. |
| 10,249,577 | B2 | 4/2019 | Lee et al. |
| 2012/0015105 | A1 | 1/2012 | Stokhof et al. |

(Continued)

FOREIGN PATENT DOCUMENTS

| | | |
|---|---|---|
| KR | 10-2007-0086958 | 8/2007 |
| KR | 10-2012-0079443 | 7/2012 |

(Continued)

*Primary Examiner* — Elmito Breval
(74) *Attorney, Agent, or Firm* — Womble Bond Dickinson (US) LLP

(57) ABSTRACT

A display device that includes a substrate, a display element disposed on the substrate and having a pixel electrode, an emission layer, and an opposite electrode, an inorganic functional layer disposed on the opposite electrode and including a first element, and a thin-film encapsulation layer disposed on the inorganic functional layer, wherein the inorganic functional layer includes a first film and a second film disposed on the first film. In each of the first film and the second film, a stoichiometric ratio of the first element decreases as distance from the substrate increases. The first element may be one of silicon (Si), titanium (Ti), aluminum (Al), hafnium (Hf), indium (In), tin (Sn), chromium (Cr), manganese (Mn), iron (Fe), tantalum (Ta), zinc (Zn), and a combination thereof.

9 Claims, 18 Drawing Sheets

(56) References Cited

U.S. PATENT DOCUMENTS

| | | | | |
|---|---|---|---|---|
| 2015/0027541 | A1* | 1/2015 | Baisl | H10K 50/8445<br>438/22 |
| 2020/0273927 | A1* | 8/2020 | Oh | H10K 59/121 |
| 2022/0115592 | A1 | 4/2022 | Sims et al. | |
| 2022/0384533 | A1 | 12/2022 | Jang et al. | |

FOREIGN PATENT DOCUMENTS

| | | |
|---|---|---|
| KR | 10-2014-0087433 | 7/2014 |
| KR | 10-2017-0129475 | 11/2017 |
| KR | 10-2020-0063377 | 6/2020 |
| KR | 10-2021-0037728 | 4/2021 |

* cited by examiner

Comparative Example

DISPLAY DEVICE AND METHOD OF MANUFACTURING SAME

CROSS-REFERENCE TO RELATED APPLICATIONS

This application claims priority under 35 U.S.C. § 119 from Korean Patent Application No. 10-2022-0143943 filed on Nov. 1, 2022 in the Korean Intellectual Property Office, the entire contents of which are incorporated herein by reference.

BACKGROUND

1. Technical Field

A display device and a method of manufacturing the display device.

2. Description of the Related Art

The application of display devices has recently diversified. As display devices have become thinner and more lightweight, the range of use thereof has widened, and research into display devices that may be used in various fields has been continuously conducted.

SUMMARY

A display device includes multiple pixels that receive electrical signals and emit light to display an image to the outside. Each of the pixels includes a display element. For example, an organic light-emitting display includes an organic light-emitting diode (OLED) as a display element. In general, in an organic light-emitting display, a thin-film transistor and an organic light-emitting diode may be formed on a substrate, and the organic light-emitting diode autonomously emits light to operate.

One or more embodiments include a display device in which an inorganic functional layer may be disposed on a display element to improve emission performance, and a method of manufacturing the display device. However, the one or more embodiments are only examples, and the scope of the disclosure may not be limited thereto.

Additional aspects will be set forth in part in the description that follows and, in part, will be apparent from the description, or may be learned by practice of the embodiments of the disclosure.

According to one or more embodiments, a display device may include a display element disposed on a substrate and may include a pixel electrode, an emission layer, and an opposite electrode, an inorganic functional layer disposed on the opposite electrode and may include a first element, and a thin-film encapsulation layer disposed on the inorganic functional layer, wherein the inorganic functional layer may include at least one first film and at least one second film disposed on the at least one first film, in each of the at least one first film and the at least one second film, a stoichiometric ratio of the first element decreases with distance from the substrate, and the first element is selected from silicon (Si), titanium (Ti), aluminum (Al), hafnium (Hf), indium (In), tin (Sn), chromium (Cr), manganese (Mn), iron (Fe), tantalum (Ta), zinc (Zn), and a combination thereof.

The at least one first film and the at least one second film may have different refractive indices from each other.

A thickness of the inorganic functional layer may be greater than or equal to about 10 Å to less than or equal to about 2000 Å.

Thickness uniformity of the inorganic functional layer may be greater than about 0% and less than or equal to about 2%.

The inorganic functional layer may include a nitride, an oxide, an oxynitride, or a combination thereof of the first element.

The at least one first film may include a plurality of first films and the at least one second film may include a plurality of second films, and the plurality of first films and the plurality of second films may be alternately disposed on each other.

The display device may further include an organic functional layer in contact with at least one of an upper surface and a lower surface of the inorganic functional layer.

The thin-film encapsulation layer may include a first inorganic encapsulation layer, an organic encapsulation layer, and a second inorganic encapsulation layer, and the first inorganic encapsulation layer may be in contact with the inorganic functional layer.

The display device may further include a pixel-defining layer exposing a part of the pixel electrode.

According to one or more embodiments, a method of manufacturing a display device may include forming a pixel electrode on a substrate, forming an emission layer on the pixel electrode, forming an opposite electrode on the emission layer, forming an inorganic functional layer including a first element on the opposite electrode, and forming a thin-film encapsulation layer on the inorganic functional layer, wherein the forming of the inorganic functional layer may include at least one deposition cycle, the deposition cycle may include supplying a first reactant into a reaction chamber during a first period, supplying a second reactant into the reaction chamber during a second period, and supplying the first reactant into the reaction chamber again during a third period that is temporally spaced-apart from the first period, and a start of the second period is after a start of the first period and before a start of the third period to allow the first reactant to be supplied to the reaction chamber even when the second reactant is not being supplied to the reaction chamber.

The second period may end after the third period ends.

The start of the second period may be during the first period.

The start of the second period may coincide with an end of the first period.

The inorganic functional layer may include a first film and a second film disposed on the first film, and the first reactant may include the first element, and in each of the first film and the second film, a stoichiometric ratio of the first element decreases as distance from the substrate increases.

The first element may be selected from silicon (Si), titanium (Ti), aluminum (Al), hafnium (Hf), indium (In), tin (Sn), chromium (Cr), manganese (Mn), iron (Fe), tantalum (Ta), zinc (Zn), and a combination thereof.

The first film may be deposited during the first period, and the second film may be deposited during the third period.

The first film and the second film may have different refractive indices from each other.

The first reactant may include a material selected from silane ($SiH_4$), silicon tetrafluoride ($SiF_4$), and a combination thereof.

The second reactant may include a material selected from ammonia ($NH_3$), nitrous oxide ($N_2O$), oxygen ($O_2$), and a combination thereof.

During the deposition cycle, a plasma gas is continuously supplied to the reaction chamber, the plasma gas is selected from argon (Ar), nitrogen ($N_2$), hydrogen ($H_2$), and a combination thereof.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
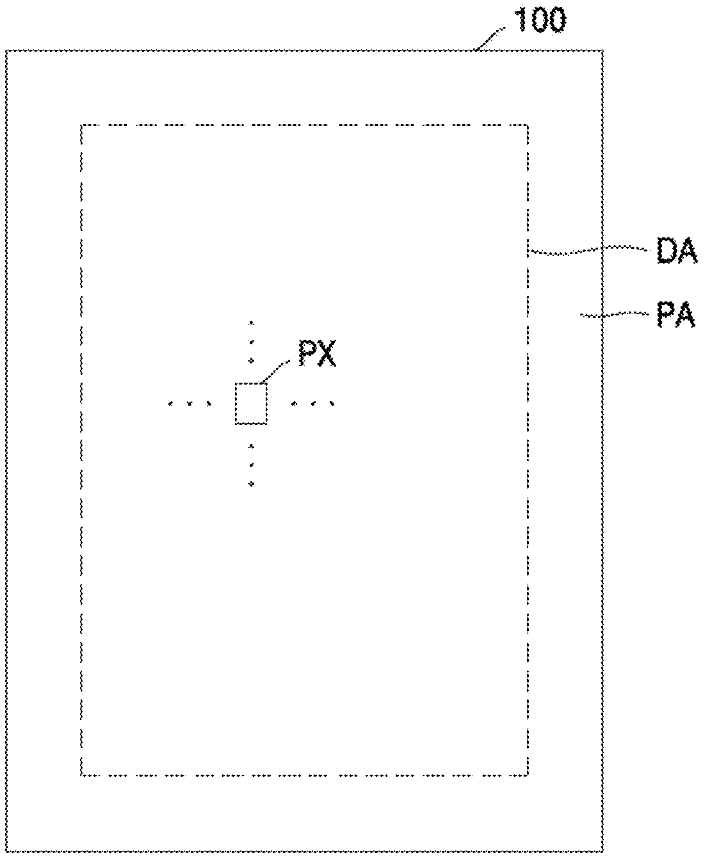
FIG. 1 is a plan view schematically illustrating part of a display device according to an embodiment of the disclosure.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals and/or reference characters denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

FIG. 1 is a plan view of a portion of a display device according to an embodiment. The display device may be a device for displaying an image and may be a portable mobile device, such as a game console, multimedia device, or micro personal computer (PC). The display device to be described later may include liquid crystal displays, electrophoretic displays, organic light-emitting displays, inorganic light-emitting displays, field emission displays, surface-conduction electron-emitter displays, quantum dot displays, plasma displays, cathode ray displays, or the like. Although an organic light-emitting display may be described below as an example of a display device according to an embodiment, a display device of various types as described above may be used in embodiments of the disclosure.

As shown in FIG. 1, the display device may include a display area DA in which multiple pixels PX may be arranged and a peripheral area PA disposed outside the display area DA. Specifically, the peripheral area PA may entirely surround the display area DA. This may be understood as that a substrate 110 included in the display device includes the display area DA and the peripheral area PA described above.

Each of the pixels PX of the display device may be an area in which light of a certain color may be emitted, and the display device may provide an image by using light emitted from the pixels PX. For example, each of the pixels PX may emit red, green, or blue light. The pixel PX may further include multiple thin-film transistors, which may be for controlling a display element and a storage capacitor. The number of thin-film transistors included in one pixel may be variously modified, for example, one to seven thin-film transistors.

The display area DA may have a polygonal shape, including a rectangle as shown in FIG. 1. For example, the display area DA may have a rectangular shape of which the horizontal length may be greater than the vertical length, a rectangular shape of which the horizontal length may be less than the vertical length, or a square shape. The display area DA may instead have any of various shapes, such as an elliptical shape or a circular shape.

The peripheral area PA may be a non-display area in which the pixels PX may not be arranged. A driver or the like for providing an electrical signal or power to the pixels PX may be arranged in the peripheral area PA. Pads (not shown), to which various electronic elements or printed circuit boards may be electrically connected, may be arranged in the peripheral area PA. Each of the pads may be arranged to be apart from each other in the peripheral area PA and may be electrically connected to the printed circuit board or an integrated circuit element. A thin-film transistor may also be arranged in the peripheral area PA, and the thin-film transistor arranged in the peripheral area PA may be part of a circuit portion for controlling an electrical signal applied into the display area DA.

Figure 2:
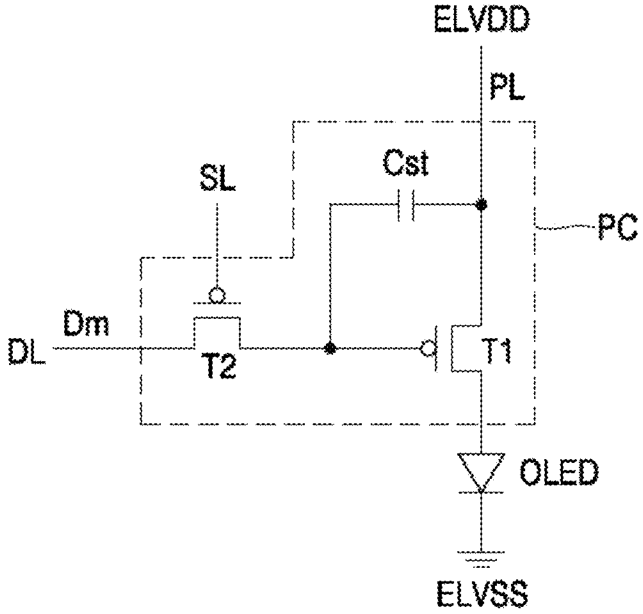
FIG. 2 is a schematic diagram of an equivalent circuit of a pixel included in the display device in FIG. 1.

FIG. 2 is a schematic diagram of an equivalent circuit of a pixel PX included in the display device in FIG. 1. As shown in FIG. 2, the pixel PX may include a pixel circuit PC and an organic light-emitting diode OLED electrically connected to the pixel circuit PC.

The pixel circuit PC may include a first transistor T1, a second transistor T2, and a storage capacitor Cst. The second transistor T2 may be a switching transistor that may be electrically connected to a scan line SL and a data line DL, and may be turned on in response to a switching signal received via the scan line SL to transfer to the first transistor T1 a data signal Dm received via the data line DL. The storage capacitor Cst has an end electrically connected to the second transistor T2 and another end electrically connected to a driving voltage line PL and may store a voltage corresponding to a difference between a voltage received from the second transistor T2 and a driving power voltage ELVDD supplied to the driving voltage line PL.

The first transistor T1 may be a driving transistor may be electrically connected to the driving voltage line PL and the storage capacitor Cst, and may control a magnitude of a driving current flowing from the driving voltage line PL to the organic light-emitting diode OLED in response to a voltage value stored in the storage capacitor Cst. The organic light-emitting diode OLED may emit light having a luminance according to the driving current. An opposite electrode 330 (see FIG. 3) of the organic light-emitting diode OLED may receive an electrode power voltage ELVSS.

In FIG. 2, the pixel circuit PC includes two transistors and one storage capacitor. However, the disclosure may not be limited thereto. For example, the number of transistors or the number of storage capacitors may be variously modified depending on the design of the pixel circuit PC.

Figure 3:
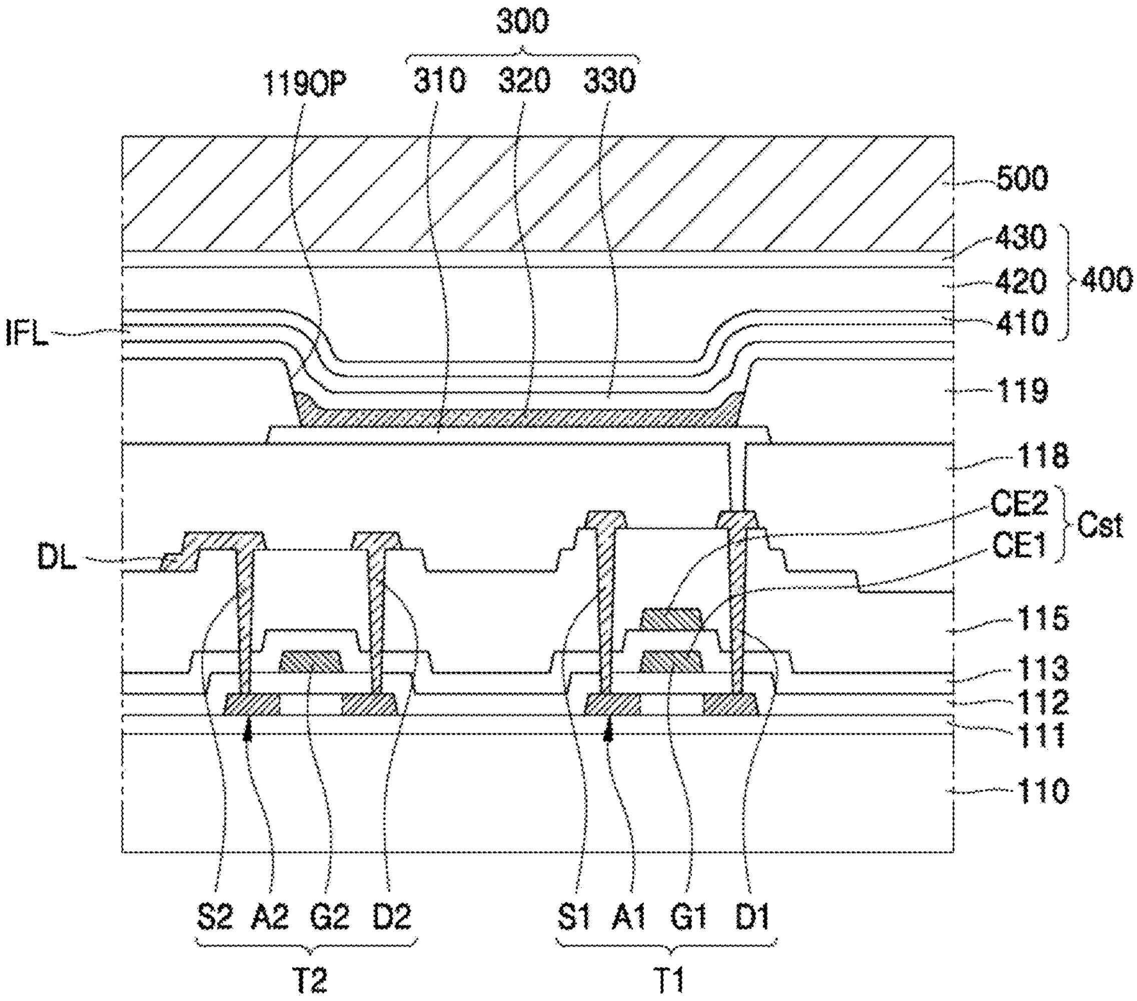
FIG. 3 is a schematic cross-sectional view of a display device according to an embodiment.
Figure 4:
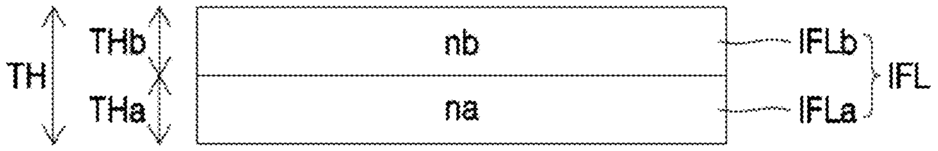
FIG. 4 is a schematic cross-sectional view illustrating an inorganic functional layer that may appear in a display device according to an embodiment.

FIG. 3 is a schematic cross-sectional view illustrating part of a display device according to an embodiment. FIG. 4 is a schematic cross-sectional view illustrating an inorganic functional layer IFL in FIG. 3. Referring to FIG. 3, the display device includes a substrate 110, transistors T1 and T2 disposed on the substrate 110, and an organic light-emitting diode 300 electrically connected to the transistors T1 and T2. The organic light-emitting display may further include various insulating layers 111, 112, 113, 115, 118, and 119 and a storage capacitor Cst.

The substrate 110 may include various materials, such as glass, metal, plastic, or a combination thereof. According to an embodiment, the substrate 110 may be a flexible substrate, and may include polymer resin such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose acetate propionate (CAP), or a combination thereof.

A buffer layer 111 may be disposed on the substrate 110 to reduce or block permeation of foreign substances, moisture, or ambient air from a lower portion of the substrate 110 and provide a flat surface on the substrate 110. The buffer layer 111 may include an inorganic material, such as an oxide or nitride, an organic material, or an organic/inorganic compound, and may include a single-layer or multi-layer structure of an inorganic material and an organic material. A barrier layer (not shown) for blocking permeation of ambient air may be further included between the substrate 110 and the buffer layer 111. In some embodiments, the buffer layer 111 may include a silicon oxide ($SiO_x$), silicon nitride ($SiN_x$), or a combination thereof.

A first transistor T1 and/or a second transistor T2 may be disposed on the buffer layer 111. The first transistor T1 may include a semiconductor layer A1, a gate electrode G1, a source electrode S1, and a drain electrode D1, and the second transistor T2 may include a semiconductor layer A2, a gate electrode G2, a source electrode S2, and a drain electrode D2. The first transistor T1 may be electrically connected to an organic light-emitting diode 300 and function as a driving thin-film transistor driving the organic light-emitting diode 300. The second transistor T2 may be electrically connected to a data line DL and function as a switching thin-film transistor. In FIG. 3, two thin-film transistors are shown. However, the disclosure may not be limited thereto. The number of thin-film transistors may instead be variously modified, for example, one to seven thin-film transistors.

The semiconductor layers A1 and A2 may include amorphous silicon or polycrystalline silicon. In an embodiment, the semiconductor layers A1 and A2 may include an oxide of at least one material selected from a group consisting of indium (In), gallium (Ga), tin (Sn), zirconium (Zr), vanadium (V), hafnium (Hf), cadmium (Cd), germanium (Ge), chromium (Cr), titanium (Ti), zinc (Zn), and a combination thereof. The semiconductor layers A1 and A2 may each include a channel area, a source area, and a drain area, the source area and the drain area being doped with impurities.

The gate electrodes G1 and G2 may be disposed over the semiconductor layers A1 and A2 with a first gate insulating layer 112 therebetween. The gate electrodes G1 and G2 include molybdenum (Mo), aluminum (Al), copper (Cu), titanium (Ti), the like, or a combination thereof, and may include a single layer or multiple layers. For example, each of the gate electrodes G1 and G2 may be a single Mo layer.

The first gate insulating layer 112 may include a silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or a combination thereof. A second gate insulating layer 113 may be provided to cover the gate electrodes G1 and G2. The second gate insulating layer 113 may include $SiO_2$, $SiN_2$, SiON, $Al_2O_3$, $TiO_2$, $Ta_2O_5$, $HfO_2$, $ZnO_2$, or a combination thereof.

A first storage electrode CE1 of the storage capacitor Cst may overlap the first transistor T1. For example, the gate electrode G1 of the first transistor T1 may function as the first storage electrode CE1 of the storage capacitor Cst. However, the disclosure may not be limited thereto. The storage capacitor Cst may instead be formed to be apart from the transistors T1 and T2 without overlapping the first transistor T1.

A second storage electrode CE2 of the storage capacitor Cst overlaps the first storage electrode CE1 with the second gate insulating layer 113 therebetween. The second gate insulating layer 113 may function as a dielectric layer of the storage capacitor Cst. The second storage electrode CE2 may include a conductive material, including Mo, Al, Cu, Ti, the like, or a combination thereof, and may include a single layer or multiple layers including the materials described above. For example, the second storage electrode CE2 may be a single Mo layer or a multi-layer of Mo/Al/Mo.

An interlayer insulating layer 115 may be formed on the entire surface of the substrate to cover the second storage electrode CE2. The interlayer insulating layer 115 may include $SiO_2$, $SiN_2$, SiON, $Al_2O_3$, $TiO_2$, $Ta_2O_5$, $HfO_2$, $ZnO_2$, or a combination thereof.

The source electrodes S1 and S2 and the drain electrodes D1 and D2 may be disposed on the interlayer insulating layer 115. The source electrodes S1 and S2 and the drain electrodes D1 and D2 may include a conductive material, including Mo, Al, Cu, Ti, the like, or a combination thereof, and may include a single layer or multiple layers including the materials described above. For example, each of the source electrodes S1 and S2 and the drain electrodes D1 and D2 may include a multi-layer structure of Ti/Al/Ti.

A planarization layer 118 may be disposed on the source electrodes S1 and S2 and the drain electrodes D1 and D2, and the organic light-emitting diode 300 may be disposed on the planarization layer 118. The organic light-emitting diode 300 includes a pixel electrode 310, an intermediate layer 320 which includes an organic emission layer, and an opposite electrode 330.

The planarization layer 118 may have a flat upper surface so that the pixel electrode 310 may be formed to be flat. The planarization layer 118 may include one or more layers including an organic material or an inorganic material. The planarization layer 118 as described above may include general-purpose polymers, such as benzocyclobutene (BCB), PI, hexamethyldisiloxane (HMDSO), polymethylmethacrylate (PMMA), polystyrene (PS), or a combination thereof, polymer derivatives having a phenol-based group, acryl-based polymers, imide-based polymers, aryl etherbased polymers, amide-based polymers, fluorine-based polymers, p-xylene-based polymers, vinyl alcohol-based polymers, any blends thereof, or a combination thereof. The planarization layer 118 may include $SiO_2$, $SiN_2$, SiON, $Al_2O_3$, $TiO_2$, $Ta_2O_5$, $HfO_2$, $ZnO_2$, or a combination thereof. After the planarization layer 118 is formed, chemical-mechanical polishing may be performed to provide a flat upper surface.

In the planarization layer 118, an opening that exposes any of the source electrode S1 and the drain electrode D1 of the first transistor T1 may be present, and the pixel electrode 310 may be in contact with the source electrode S1 or the drain electrode D1 through the opening to be electrically connected to the first transistor T1.

The pixel electrode 310 may be disposed on the planarization layer 118. The pixel electrode 310 may include a conductive oxide, such as indium tin oxide (ITO), indium zinc oxide (IZO), zinc oxide (ZnO), indium oxide ($In_2O_3$), indium gallium oxide (IGO), aluminum zinc oxide (AZO), or a combination thereof. In an embodiment, the pixel electrode 310 may include a reflective layer including silver (Ag), magnesium (Mg), Al, platinum (Pt), palladium (Pd), gold (Au), nickel (Ni), neodymium (Nd), iridium (Ir), chromium (Cr), any compounds thereof, or a combination thereof. In an embodiment, the pixel electrode 310 may further include a layer including ITO, IZO, ZnO, $In_2O_3$, or a combination thereof, on and/or below the reflective layer described above.

A pixel-defining layer 119 may be disposed on the pixel electrode 310. The pixel-defining layer 119 may have an opening 1190P corresponding to each of sub-pixels. For example, the opening 1190P may expose at least a central portion of the pixel electrode 310, thereby defining a pixel. The pixel-defining layer 119 may increase a distance between an edge of the pixel electrode 310 and the opposite electrode 330 to prevent an arc or the like from occurring therebetween. For example, the pixel-defining layer 119 may include an organic material, such as PI or HMDSO.

A spacer (not shown) may be disposed over the pixel-defining layer 119. The spacer may prevent a mask dent that may occur during a masking process necessary for forming the intermediate layer 320 of the organic light-emitting diode 300, or the like. The spacer may include an organic material such as PI or HMDSO. The spacer may be simultaneously formed with the pixel-defining layer 119 and include a same material, and may be produced using a half-tone mask.

The intermediate layer 320 of the organic light-emitting diode 300 may include an organic emission layer. The organic emission layer may include an organic material including a fluorescent or phosphorescent material emitting red, green, blue, or white light. The organic emission layer may be a low-molecular weight organic material, polymer organic material, or a combination thereof. Under and over the organic emission layer, a functional layer such as a hole transport layer (HTL), a hole injection layer (HIL), an electron transport layer (ETL), and an electron injection layer (EIL), may further be selectively disposed. The intermediate layer 320 may be arranged to correspond to each of the pixel electrodes 310. However, the disclosure may not be limited thereto. The intermediate layer 320 may instead include a layer that may be integral as a single body across the pixel electrodes 310, and various modifications may be made.

The opposite electrode 330 may be a light-transmitting electrode or reflective electrode. In some embodiments, the opposite electrode 330 may be a transparent or semi-transparent electrode, and may include a metal thin-film having a low work function, which includes lithium (Li), calcium (Ca), lithium fluoride (LiF)/Ca, LiF/Al, Al, Ag, Mg, any compounds thereof, or a combination thereof. A transparent conductive oxide (TCO) layer including ITO, IZO, ZnO, or $In_2O_3$, or a combination thereof may be further disposed on the metal thin-film. The opposite electrode 330 may be arranged across the display area DA and the peripheral area PA, and may be disposed over the intermediate layer 320 and the pixel-defining layer 119. The opposite electrode 330 may be integral as a single body in the organic light-emitting diodes 300 and correspond to the pixel electrodes 310.

An inorganic functional layer IFL may be disposed on the opposite electrode 330. The inorganic functional layer IFL may improve external emission efficiency of an organic light-emitting element by the principle of constructive interference. The display device may improve light efficiency by introducing a microcavity. In case that a reflectivity of the opposite electrode 330 may not be high, resonance does not occur well, and thus the inorganic functional layer IFL may be disposed on the opposite electrode to increase light efficiency. The inorganic functional layer IFL may be formed through a pulsed-chemical vapor deposition (CVD) process.

The inorganic functional layer IFL may include a first element that may be any one of silicon (Si), Ti, Al, Hf, In, Sn, Cr, manganese (Mn), iron (Fe), tantalum (Ta), Zn, or a combination thereof. The first element may be a base element of the inorganic functional layer IFL. The inorganic functional layer IFL may include a nitride, an oxide, an oxynitride, or a combination thereof of the first element.

Referring to FIG. 4, the inorganic functional layer IFL may include a first film IFLa and a second film IFLb. The second film IFLb may be disposed on the first film IFLa.

In each of the first film IFLa and the second film IFLb, a ratio or stoichiometric ratio of the first element may decrease as distance from the substrate 110 increases. In other words, a stoichiometric ratio of the first element may be higher at a lower portion of the first film IFLa than at an upper portion of the first film IFLa, and a stoichiometric ratio of the first element may be higher at a lower portion of the second film IFLb than at an upper portion of the second film IFLb. In other words, in each of the first film IFLa and the second film IFLb, a stoichiometric ratio of the first element increases toward the lower portion thereof, and a stoichiometric ratio of nitrogen (N) or oxygen (O) may increase toward the upper portion thereof. For example, in case that the inorganic functional layer IFL includes $SiN_x$ which may be a nitride of a silicon (Si) that may be a first element, a stoichiometric ratio of Si increases and a stoichiometric ratio of N decreases in moving from the upper portion to the lower portion of the first film IFLa. Similarly, a stoichiometric ratio of Si increases and a stoichiometric ratio of N decreases in moving from the upper portion to the lower portion of the second film IFLb. The inorganic functional layer IFL includes the first film IFLa and the second film IFLb having different element stoichiometric composition ratios in upper and lower portions, so that thickness uniformity may be improved.

The inorganic functional layer IFL may be formed through a pulsed-CVD process. In case that a first reactant including a first element may be intermittently supplied to a reaction chamber and a second reactant including ammonia ($NH_3$) may be continuously supplied even after the intermittent supply of each first reactant may be terminated, nitriding may be most actively performed in the upper portion of each of the first film IFLa and the second film IFLb and may be less performed toward the lower portion. In case that the first reactant may be supplied before the second reactant may be supplied, this effect may be further maximized. By introducing the reactants into the reaction chamber as such, the inorganic functional layer IFL including the first film IFLa and the second film IFLb having the characteristics described above may be provided. This may be described in detail later.

Within one inorganic functional layer IFL, the first film IFLa and the second film IFLb may be separate. The inorganic functional layer IFL includes the first film IFLa and the second film IFLb having the characteristics described above, thereby having layer by layer film formation characteristics. In other words, in case that the inorganic functional layer IFL includes the first film IFLa and the second film IFLb having different stoichiometric ratios of the first element at the upper and lower portions, thickness uniformity of the inorganic functional layer IFL may be improved compared to the case that the inorganic functional layer IFL includes a single layer having a same stoichiometric ratio of the first element at the upper and lower portions. The thickness uniformity of the inorganic functional layer IFL may be greater than about 0% and less than or equal to about 2%.

A thickness TH of the inorganic functional layer IFL may be provided to be greater than or equal to about 10 Å to less than or equal to about 2000 Å. In FIG. 4, a first thickness THa of the first film IFLa and a second thickness THb of the second IFLb may be equal to each other. However, the first thickness THa may instead be greater or less than the second thickness THb, and the thicknesses may be adjusted depending on the desired optical properties.

The first film IFLa and the second film IFLb included in the inorganic functional layer IFL and distinguished from each other may have different refractive indices from each other. A first refractive index na of the first film IFLa may be greater or less than a second refractive index nb of the second film IFLb. The first refractive index na and the second refractive index nb may range from about 1.4 to about 2.6. This may be formed by adjusting average content of the first element included in the first film IFLa and in the second IFLb. For example, in case that the inorganic functional layer IFL includes $SiN_x$ which may be a nitride of Si that may be a first element, and average content of Si may be greater in the first film IFLa than in the second film IFLb resulting in the first refractive index na being greater than the second refractive index nb.

The inorganic functional layer IFL includes the first film IFLa and the second film IFLb having the characteristics described above, to improve the thickness uniformity of the inorganic functional layer IFL and readily adjusts a refractive index by widening an available refractive index range of the inorganic functional layer IFL to improve emission efficiency.

A thin-film encapsulation layer 400 encapsulating the display area DA may be further included in an upper portion of the inorganic functional layer IFL. The thin-film encapsulation layer 400 may cover the display area DA and protect the organic light-emitting diode 300 or the like from external moisture or oxygen. This thin-film encapsulation layer 400 may include a first inorganic encapsulation layer 410, an organic encapsulation layer 420, and a second inorganic encapsulation layer 430.

The first inorganic encapsulation layer 410 covers the inorganic functional layer IFL and may include a ceramic, a metal oxide, a metal nitride, a metal carbide, a metal oxynitride, $In_2O_3$, tin oxide ($SnO_2$), ITO, a silicon oxide, a silicon nitride, a silicon oxynitride, or a combination thereof. Because this first inorganic encapsulation layer 410 may be formed along a structure thereunder, an upper surface thereof may not be flat, as shown in FIG. 3.

The organic encapsulation layer 420 covers this first inorganic encapsulation layer 410, and unlike the first inorganic encapsulation layer 410, an upper surface of the organic encapsulation layer 420 may be approximately flat. Specifically, the upper surface of the organic encapsulation layer 420 may be approximately flat in a portion corresponding to the display area DA. The organic encapsulation layer 420 may include one or more materials selected from a group consisting of acrylic, methacrylic, polyester, polyethylene, polypropylene, PET, PEN, PC, PI, polyethylene sulfonate, polyoxymethylene, polyarylate, HMDSO, and a combination thereof.

The second inorganic encapsulation layer 430 covers the organic encapsulation layer 420 and may include a ceramic, a metal oxide, a metal nitride, a metal carbide, a metal oxynitride, $In_2O_3$, $SnO_2$, ITO, a silicon oxide, $SiN_x$, SiON, or a combination thereof. This second inorganic encapsulation layer 430 may be in contact with the first inorganic encapsulation layer 410 at an edge of the second inorganic encapsulation layer 430 disposed in peripheral area PA outside the display area DA, so that the organic encapsulation layer 420 may not be exposed to the outside.

As described above, the thin-film encapsulation layer 400 includes the first inorganic encapsulation layer 410, the organic encapsulation layer 420, and the second inorganic encapsulation layer 430, and thus even in case that cracks occur in the thin-film encapsulation layer 400 through this multi-layer structure, those cracks may not extend from the first inorganic encapsulation layer 410 to the organic encapsulation layer 420 or from the organic encapsulation layer 420 to the second inorganic encapsulation layer 430. Accordingly, the formation of a path through which the moisture or oxygen from the outside permeates into the display area DA may be prevented or minimized.

Although in the embodiment the thin-film encapsulation layer 400 may be used as an encapsulation member encapsulating the organic light-emitting diode 300, the disclosure may not be limited thereto. For example, a sealing substrate to be bonded to the substrate 110 by means of a sealant or frit may also be used as a member for sealing the organic light-emitting diode 300.

An anti-reflection layer 500 for improving outdoor visibility may be disposed over the thin-film encapsulation layer 400 or over the sealing substrate. The anti-reflection layer 500 may include a polarizing film (not shown). A color filter (not shown) and a light-shielding layer (not shown) may also be included.

Figure 5A:
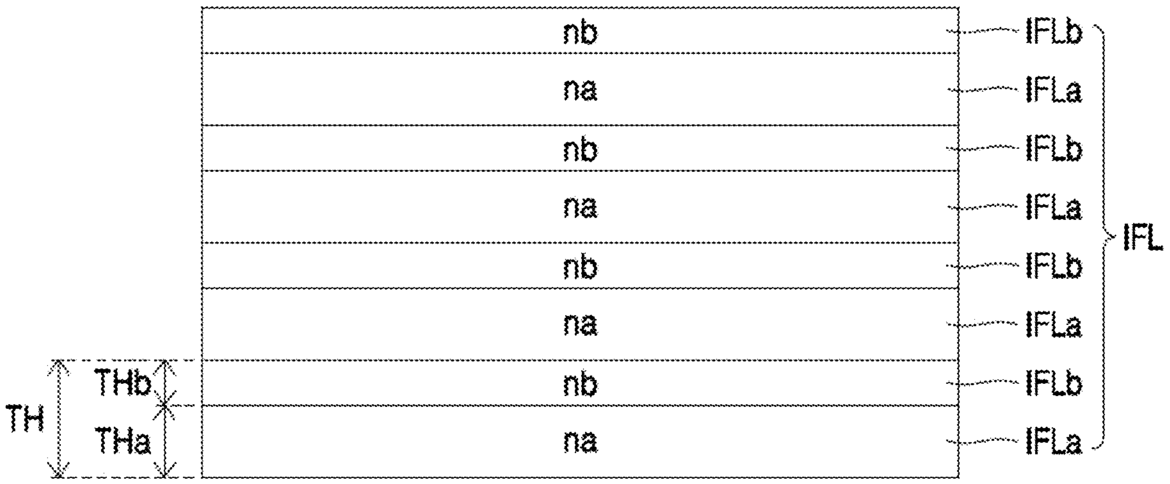
FIGS. 5A and 5B are schematic cross-sectional views illustrating an inorganic functional layer included in a display device according to one or more embodiments.
Figure 5B:
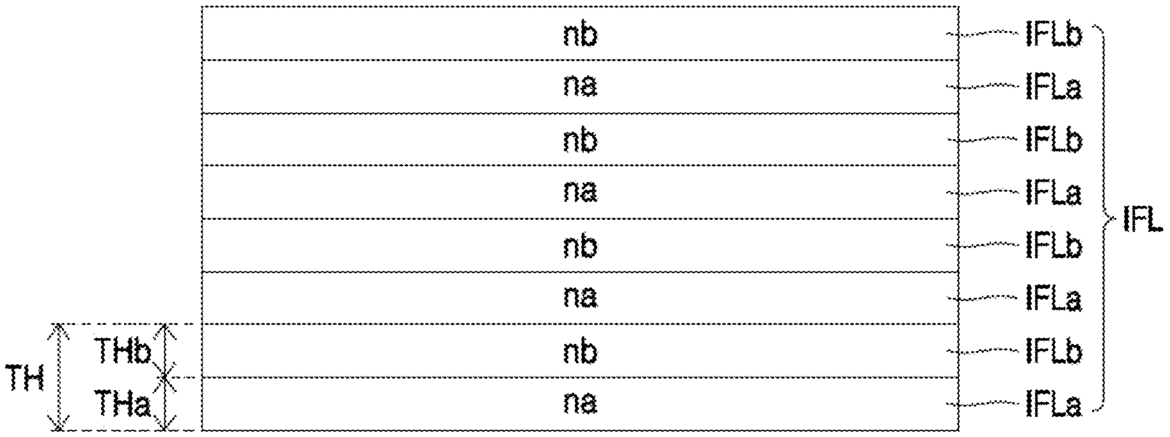
Figure 6A:
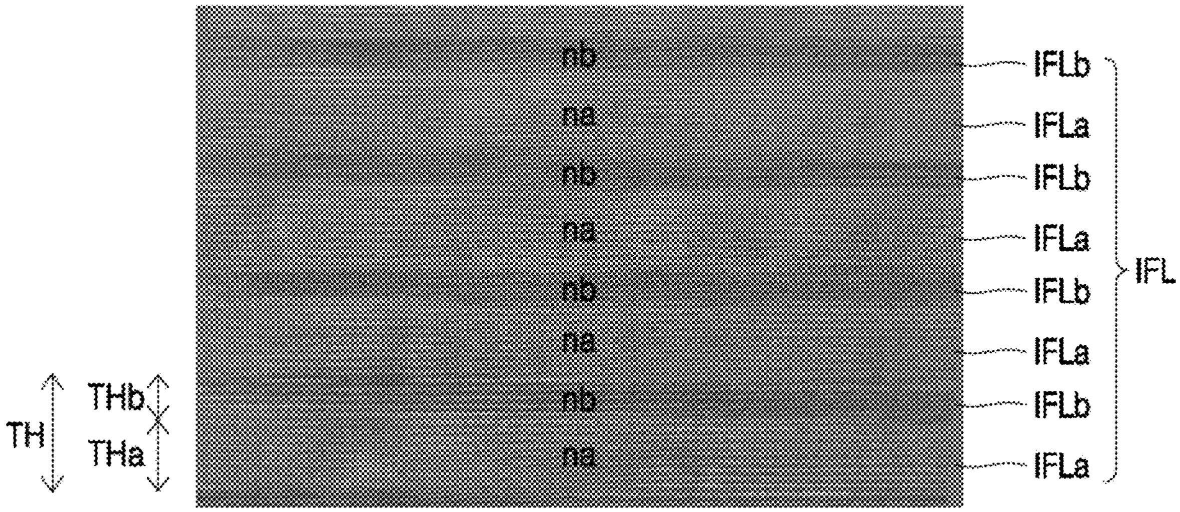
FIGS. 6A and 6B are photographs showing a schematic cross-sectional view of the functional layer included in a display device according to one or more embodiments.
Figure 6B:
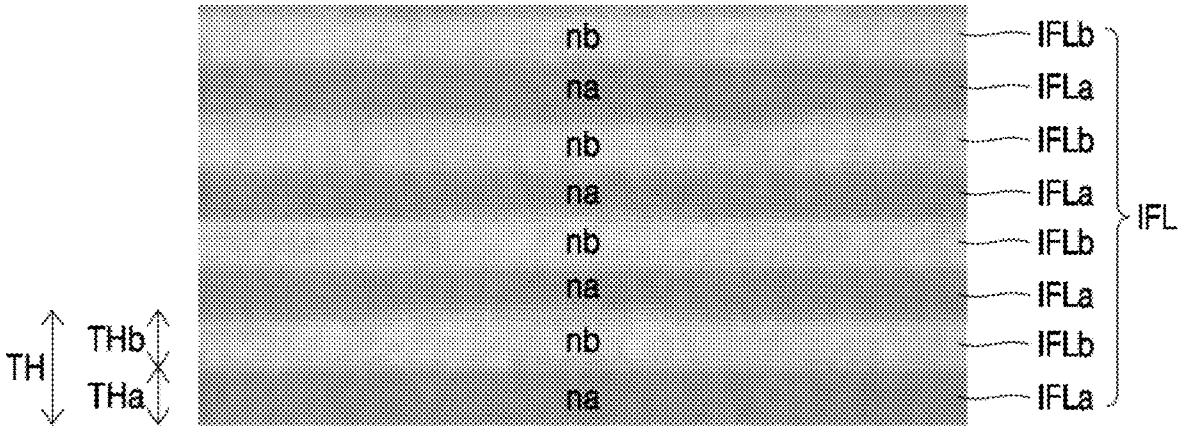

FIGS. 5A and 5B are schematic cross-sectional views illustrating the inorganic functional layer IFL included in the display device according to one or more embodiments, and FIGS. 6A and 6B are photos showing a schematic cross-section of the inorganic functional layer IFL included in the display device according to different embodiments. FIG. 6A is a photo of the embodiment of FIG. 5A, and FIG. 6B is a photo of the embodiment of FIG. 5B.

Referring to FIGS. 5A and 5B, in an embodiment, each of the first film IFLa and the second film IFLb may be provided in a plural. The inorganic functional layer IFL may include the first film IFLa and the second film IFLb that may be alternately stacked on each other. In other words, the inorganic functional layer IFL may be provided in which the first films IFLa and the second films IFLb may be alternately stacked on each other.

Referring to FIG. 5A, in an embodiment, the first film IFLa may be thicker than the second film IFLa. The first thickness THa of the first film IFLa may be greater than the second thickness THb of the second film IFLb. Referring to FIG. 5B, in an embodiment, the first thickness THa of the first film IFLa may be equal to the second thickness THb of the second film IFLb. Although not shown, the first thickness THa of the first film IFLa may instead be less than the second thickness THb of the second film IFLb.

FIGS. 6A and 6B are photos of an embodiment in which the inorganic functional layer IFL includes $SiN_x$. In the photos, a portion with high Si content may be shown lighter. Referring to FIG. 6A, in an embodiment, average Si content may be greater in the first film IFLa than in the second film IFLb. Referring to FIG. 6B, in an embodiment, the average Si content may be less in the first film IFLa than in the second film IFLb. A refractive index of the first film IFLa and the second film IFLb may be adjusted through content of the first element (herein, Si), and optical properties of the inorganic functional layer IFL may be finely adjusted by adjusting the thicknesses of the first film IFLa and the second film IFLb.

Figure 7A:
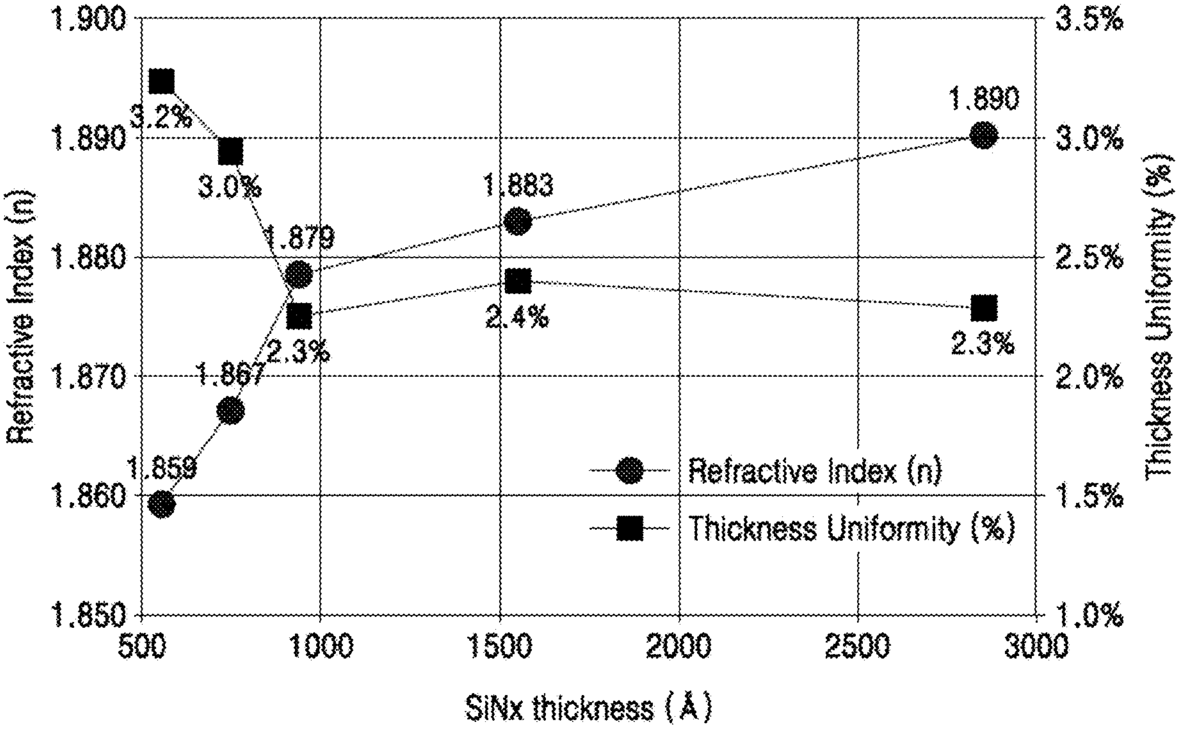
FIGS. 7A and 7B are graphs showing a refractive index and thickness uniformity of a functional layer of a display device according to a comparative example and an embodiment.
Figure 7B:
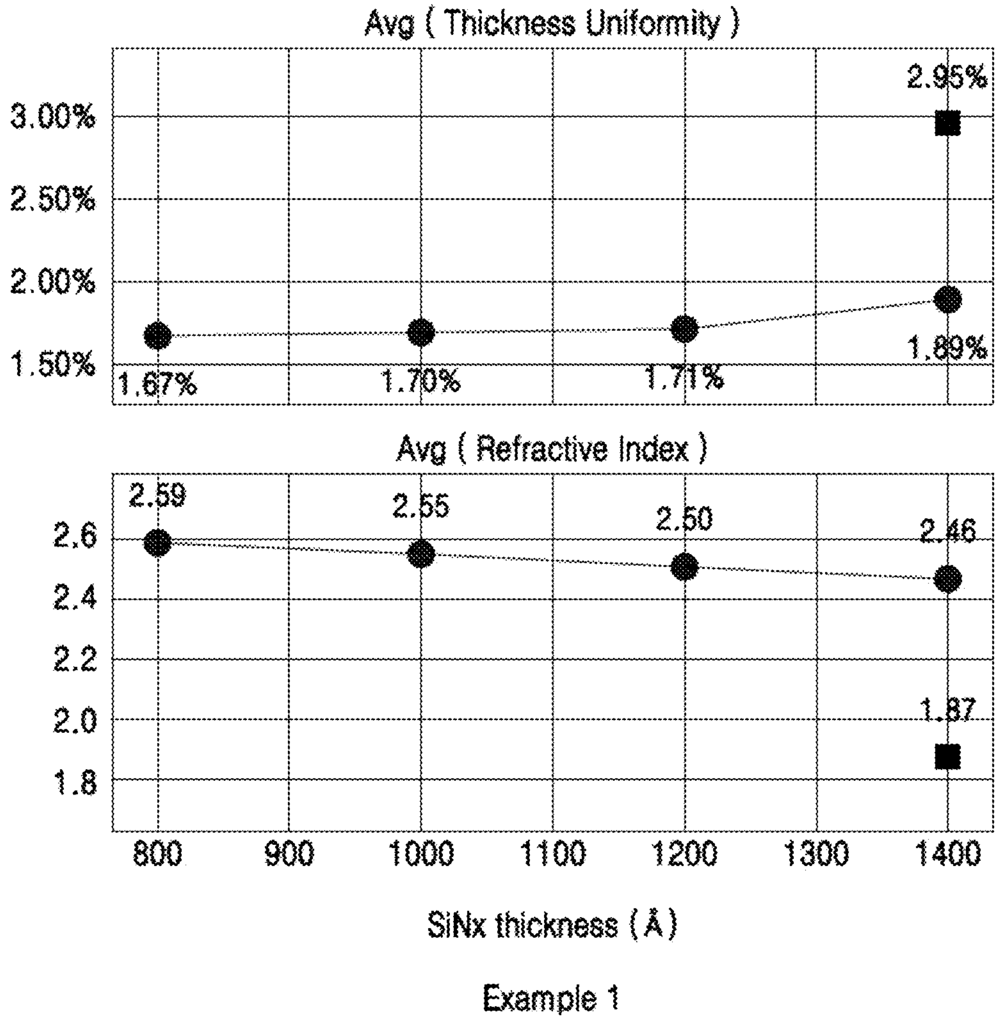

FIGS. 7A and 7B are graphs showing a refractive index (n) and thickness uniformity percentage of a functional layer of the display device. The lower the thickness uniformity (%), the more uniform the thickness. FIG. 7A shows a comparative example, and FIG. 7B shows Example 1. In both the comparative example and Example 1, the inorganic functional layer IFL includes $SiN_x$. In other words, Si was used as the first element. The inorganic functional layer IFL of the comparative example has a same Si stoichiometric ratio in the upper and lower portions, and the inorganic functional layer IFL of Example 1 includes the first film IFLa and the second film IFLb in which a Si stoichiometric ratio increases toward the lower portion of each.

Referring to FIG. 7A, thickness uniformity of the comparative example has a range of about 2.3% to about 3.2% in a thickness range of about 500 Å to about 3000 Å. In particular, in a range of less than or equal to about 1000 Å, the thickness uniformity increases, for example, the degree of uniformity decreases. In the comparative example, the inorganic functional layer IFL may be formed through a general CVD process, and because reactants react in a gaseous state and are randomly piled up at a location to which the reactants are to be deposited, it can be seen through the graph that the less the thickness, the less uniformly of thickness is deposited. On the other hand, referring to FIG. 7B, Example 1 has an excellent thickness uniformity range of about 1.67% to about 1.89% in a thickness ranging from about 800 Å to about 1400 Å. This may be because in Example 1, the first film IFLa and the second film IFLb may be formed by appropriately adjusting not only the gaseous reaction of general CVD, but also the surface reaction.

Figure 8:
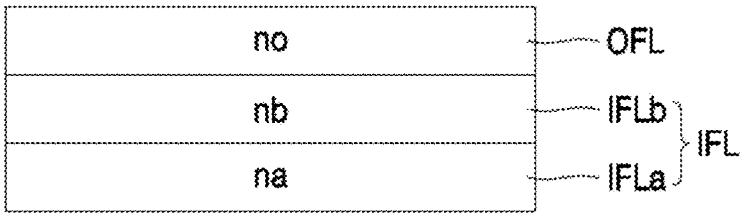
FIG. 8 is a schematic cross-sectional view schematically illustrating an area around an inorganic functional layer that may appear in a display device according to an embodiment.

FIG. 8 is a schematic cross-sectional view illustrating a region around an inorganic functional layer that may appear in the display device, according to an embodiment. In an embodiment, the display device may include an organic functional layer OFL having a refractive index no that may be in contact with an upper surface or lower surface of the inorganic functional layer IFL. The organic functional layer OFL may improve not only external emission efficiency of an organic light-emitting element together with the inorganic functional layer IFL, but also flexibility of the display device by being disposed on the upper surface or lower surface of the inorganic functional layer IFL. In FIG. 8, the organic functional layer OFL may be disposed on the upper surface of the inorganic functional layer IFL. However, unlike the above, the organic functional layer OFL may also be disposed on the lower surface of the inorganic functional layer IFL. The organic functional layer OFL may instead be disposed on both the upper surface and the lower surface of the inorganic functional layer IFL.

The organic functional layer OFL may include at least one selected from a group consisting of tris(8-hydroxyquinoline) aluminium (Alq3), ZnSe, 2,5-bis(6'-(2',2"-bipyridyl))-1,1-dimethyl-3,4-diphenylsilole, 4'-bis[N-(1-napthyl)-N-phenyl-amion] biphenyl (α-NPD), N,N'-diphenyl-N,N'-bis(3-methylphenyl)-1,1'-biphenyl-4,4'-diamine (TPD), 1,1'-bis (di-4-tolylaminophenyl) cyclohexane (TAPC), triarylamine derivatives (EL301), 8-Quinolinolato Lithium(Liq), and N(diphenyl-4-yl)9,9-dimethyl-N-(4(9-phenyl[1]9H-carbazol-3-yl)phenyl)-9H-fluorene-2-amine(HT211), 2-(4-(9,10-di(naphthalene-2-yl)anthracene-2-yl)phenyl)-1-phenyl-1H-benzo-[D]imidazole(LG201), and a combination thereof. Examples of an inorganic material may include one or more selected from the group consisting of ITO, IZO, $SiO_x$, $SiN_x$, yttrium oxide ($Y_2O_3$), tungsten trioxide ($WO_3$), molybdenum trioxide ($MoO_3$), $Al_2O_3$, or a combination thereof.

Figure 9A:
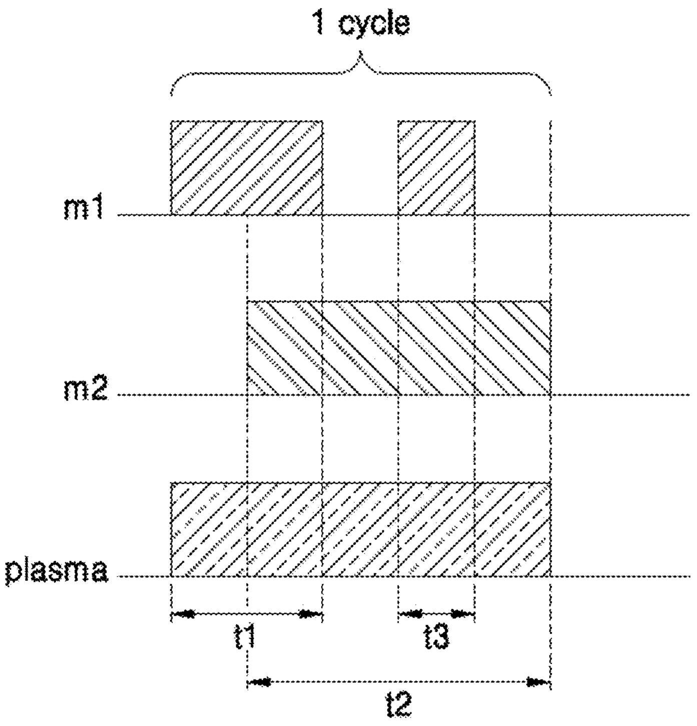
FIGS. 9A and 9B are timing diagrams of deposition cycles that may be included in a method of manufacturing a display device according to an embodiment.
Figure 9B:
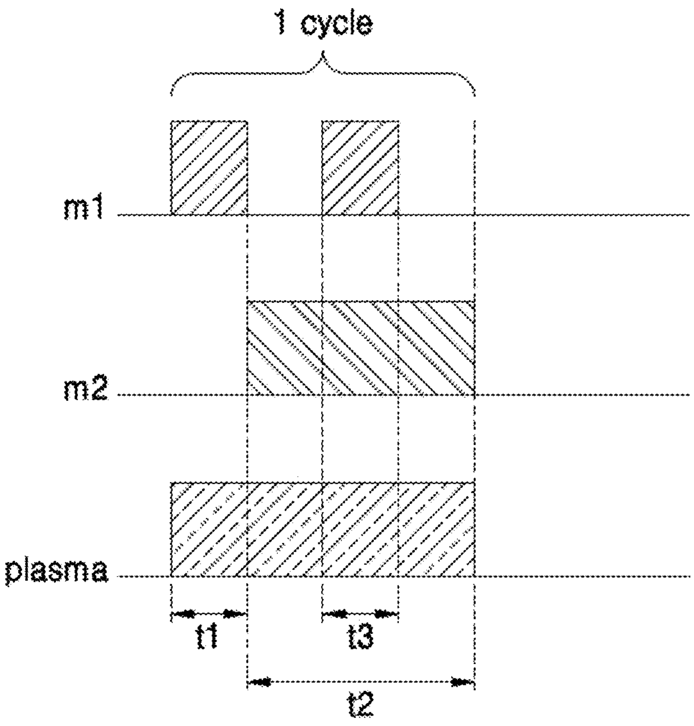

FIGS. 9A and 9B are deposition cycles that may be included in a method of manufacturing a display device, according to an embodiment. FIGS. 10 to 14 are schematic cross-sectional views illustrating a method of manufacturing a display device, according to an embodiment.

Figure 10:
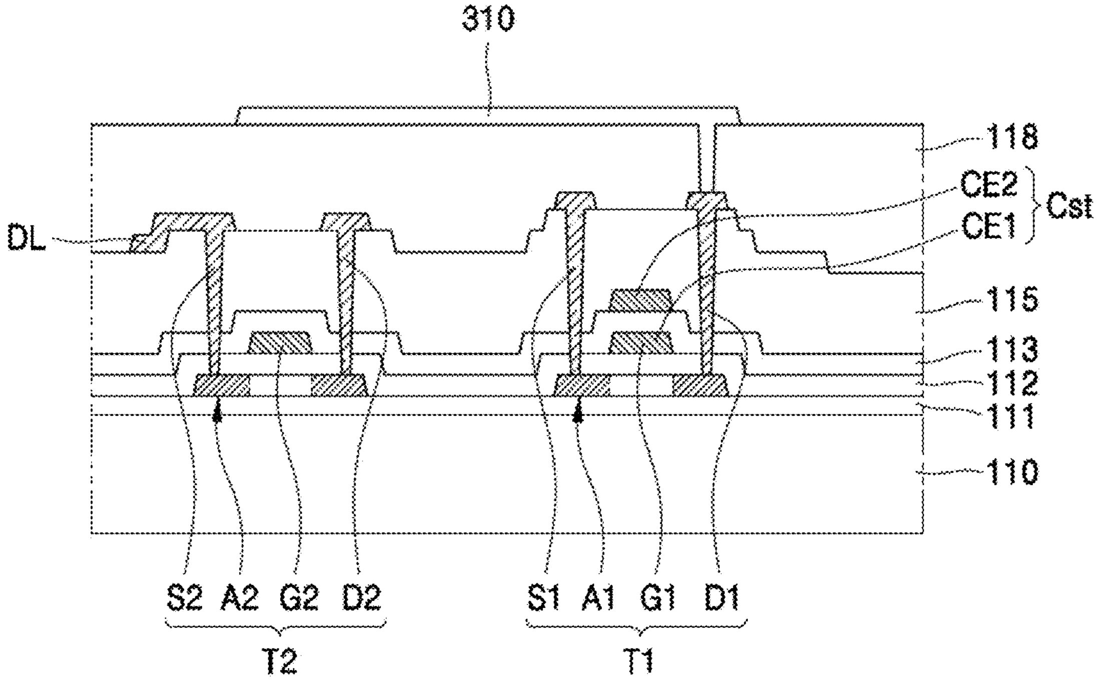
FIGS. 10 to 14 are schematic cross-sectional views illustrating a method of manufacturing a display device according to an embodiment.
Figure 11:
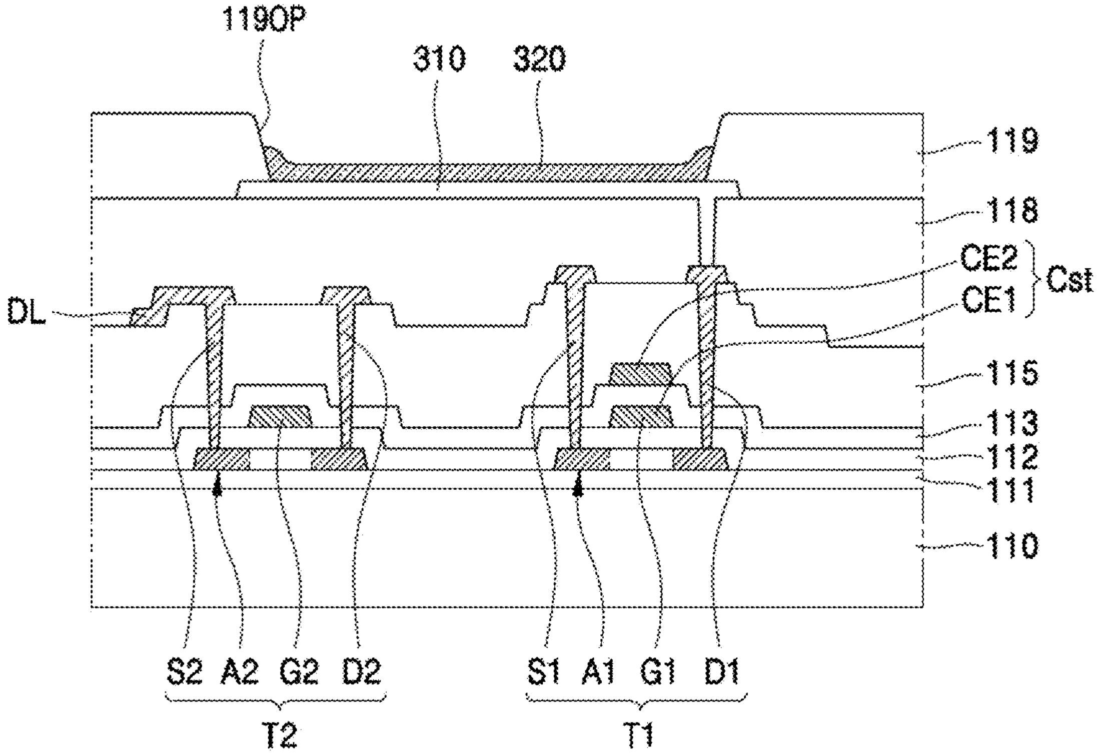

Referring to FIG. 10, the arrangement of FIG. 10 includes a substrate 110, transistors T1 and T2 disposed on the substrate 110, and a pixel electrode 310 electrically connected to the first transistor T1. Although omitted in FIG. 10, the pixel electrode 310 may be formed to be patterned for each pixel PX as opposed to being integral for all pixels in display area DA. Referring to FIG. 11, a pixel-defining layer 119 exposing a central portion of the pixel electrode 310 may be formed. The pixel-defining layer 119 may be formed through an exposure and development process using a mask after applying a material forming the pixel-defining layer. The pixel-defining layer 119 may be disposed on a planarization layer 118. The pixel-defining layer 119 may have an opening 1190P corresponding to each of sub-pixels, thereby defining the pixel PX. An intermediate layer 320 may be formed on the pixel electrode 310. The intermediate layer 320 may include an organic emission layer EML. The intermediate layer 320 may be formed to correspond to each of the pixel electrodes 310. Unlike the arrangement shown in FIG. 11, the intermediate layer 320 may include a layer that may be integral as a single body across the pixel electrodes 310 of display area DA, and various modifications may be made.

Figure 12:
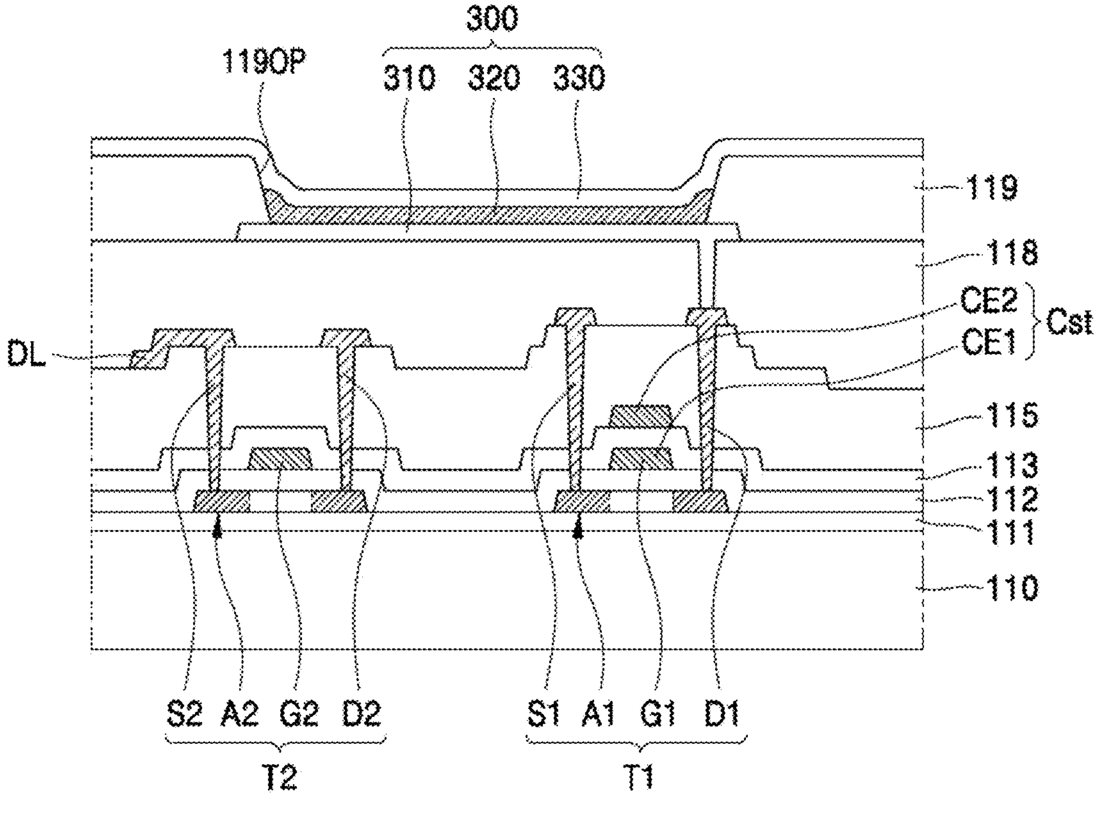

Referring to FIG. 12, an opposite electrode 330 may be formed on the intermediate layer 320. The opposite electrode 330 may be formed to cover the intermediate layer 320 and the pixel-defining layer 119. The opposite electrode 330 may be arranged to cover the display area DA. In other words, the opposite electrode 330 may be integral across the display area DA as a single body in multiple organic light-emitting elements, and correspond to the pixel electrodes 310.

Figure 13:
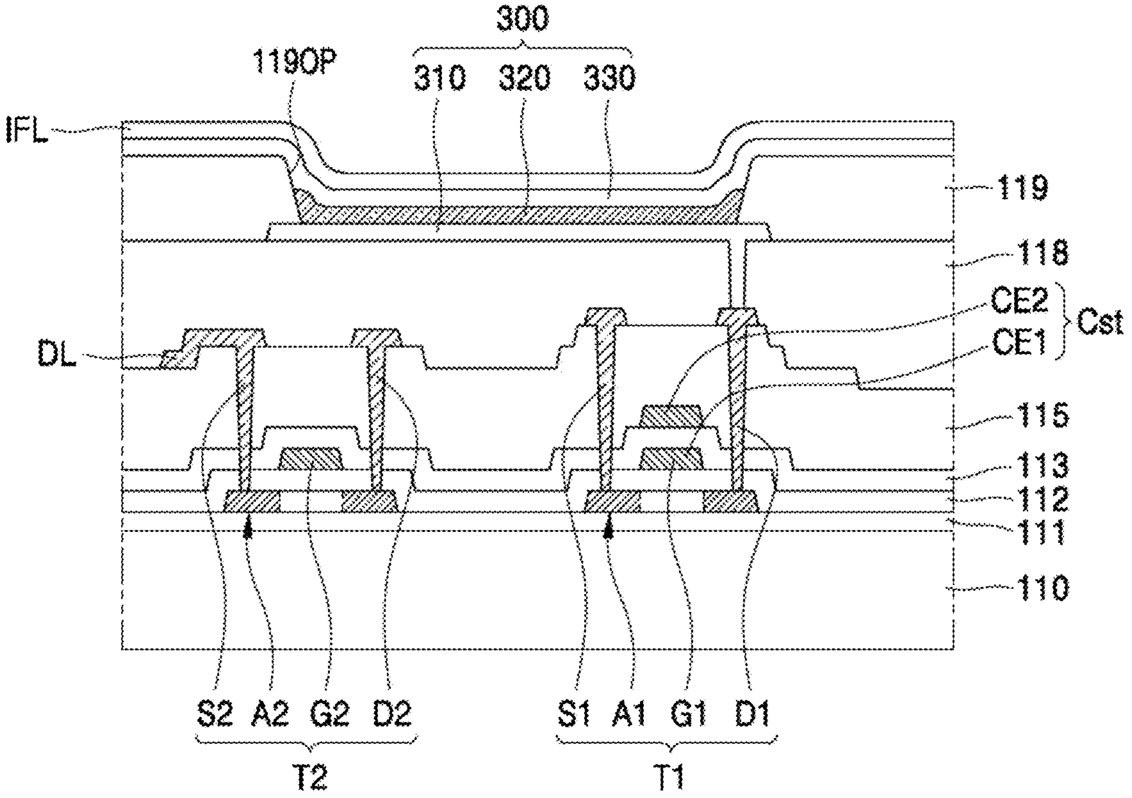

Referring to FIG. 13, an inorganic functional layer IFL may be formed on the opposite electrode 330. A method of manufacturing a display device according to an embodiment includes preparing the substrate 110, forming the pixel electrode 310 on the substrate 110, forming an emission layer EML on the pixel electrode 310, forming the opposite electrode 330 on the emission layer EML, forming the inorganic functional layer IFL on the opposite electrode 330, and forming a thin-film encapsulation layer 400 on the inorganic functional layer IFL.

The forming of the inorganic functional layer IFL may include at least one deposition cycle. FIGS. 9A and 9B are timing diagrams of deposition cycles that may be included in a method of manufacturing a display device according to an embodiment. Referring to FIGS. 9A and 9B, the deposition cycle may include supplying a first reactant m1 to a reaction chamber during a first period t1, supplying a second reactant m2 to the reaction chamber during a second period t2, and supplying the first reactant m1 to the reaction chamber again during a third period t3 that may be disconnected or temporally separated or temporally spaced-apart from the first period t1. During the deposition cycle, at least one of argon (Ar), nitrogen ($N_2$), and hydrogen ($H_2$) may be continuously supplied as plasma gas.

The first reactant m1 may include a first element included in the inorganic functional layer IFL. The first element may be any of Si, Ti, Al, Hf, In, Sn, Cr, Mn, Fe, Ta, Zn, or a combination thereof. The inorganic functional layer IFL may include a nitride, an oxide, an oxynitride, or a combination thereof of the first element. In an embodiment, in case that the first element may be Si, the first reactant m1 may be silane ($SiH_4$), silicon tetrafluoride ($SiF_4$), or a combination thereof. The second reactant m2 may include at least one of ammonia ($NH_3$), nitrous oxide ($N_2O$), and oxygen ($O_2$).

Referring to FIGS. 4, 9A and 9B together, the first film IFLa may be deposited from the start of the first period t1 during which the first reactant m1 may be supplied until before the start of the third period t3 that may be temporally spaced-apart from the first period t1. The second film IFLb may be deposited from the start of the third period t3 during which the first reactant m1 may be supplied again until before the restart of the first period t1. Accordingly, the inorganic functional layer IFL may include the first film IFLa and the second film IFLb on the first film IFLa. In an embodiment, by supplying different content of first element during the first period t1 and the third period t3, the first reactive index na of the first film IFLa and the second refractive index nb of the second film IFLb may be differently formed.

The second period t2 may start between the start of the first period t1 and the start of the third period t3, and the second period t2 may end after the third period t3 ends. In other words, the second reactant m2 may be supplied even after the end of the first period t1 and the end of the third period t3, at which the supply of the first reactant m1 stops. Accordingly, a ratio of the first element may vary in the upper and lower portions of each of the first film IFLa and the second film IFLb. This may be because, in case that the second reactant m2 may be continuously supplied even after the intermittent supply of the first reactant m1, a reaction between the first reactant m1 and the second reactant m2 occurs in a surface or upper portion of each of the first film IFLa and the second film IFLb.

In other words, in the first film IFLa and the second film IFLb, a stoichiometric ratio of the first element included in the first reactant m1 increases in a thickness direction as the distance from the substrate 110 decreases and where permeation of the second reactant m2 may be difficult.

In case that the second period t2 starts between the start of the first period t1 and the start of the third period t3, the first reactant m1 may be supplied to the reaction chamber even in case that the second reactant m2 may not be supplied to the reaction chamber. A gaseous reaction during the formation of the first film IFLa may be reduced, and a ratio of the first element in the lower portion may be further increased. The start of the second period t2 during which the second reactant m2 may be supplied may occur during the first period t1 as shown in FIG. 9A, or may coincide with the end of the first period t1 as shown in FIG. 9B or may instead be located thereafter.

In an embodiment, in case that different contents of the first element may be supplied during the first period t1 and the third period t3, the first refractive index na of the first film IFLa and the second refractive index nb of the second film IFLb may be differently configured.

In case that the deposition cycle as described above may be repeated multiple times, the first film IFLa and the second film IFLb may be provided in plural, and the inorganic functional layer IFL may be provided in which the first films IFLa and the second films IFLb may be alternately arranged as in for example FIG. 5A or 5B.

Figure 14:
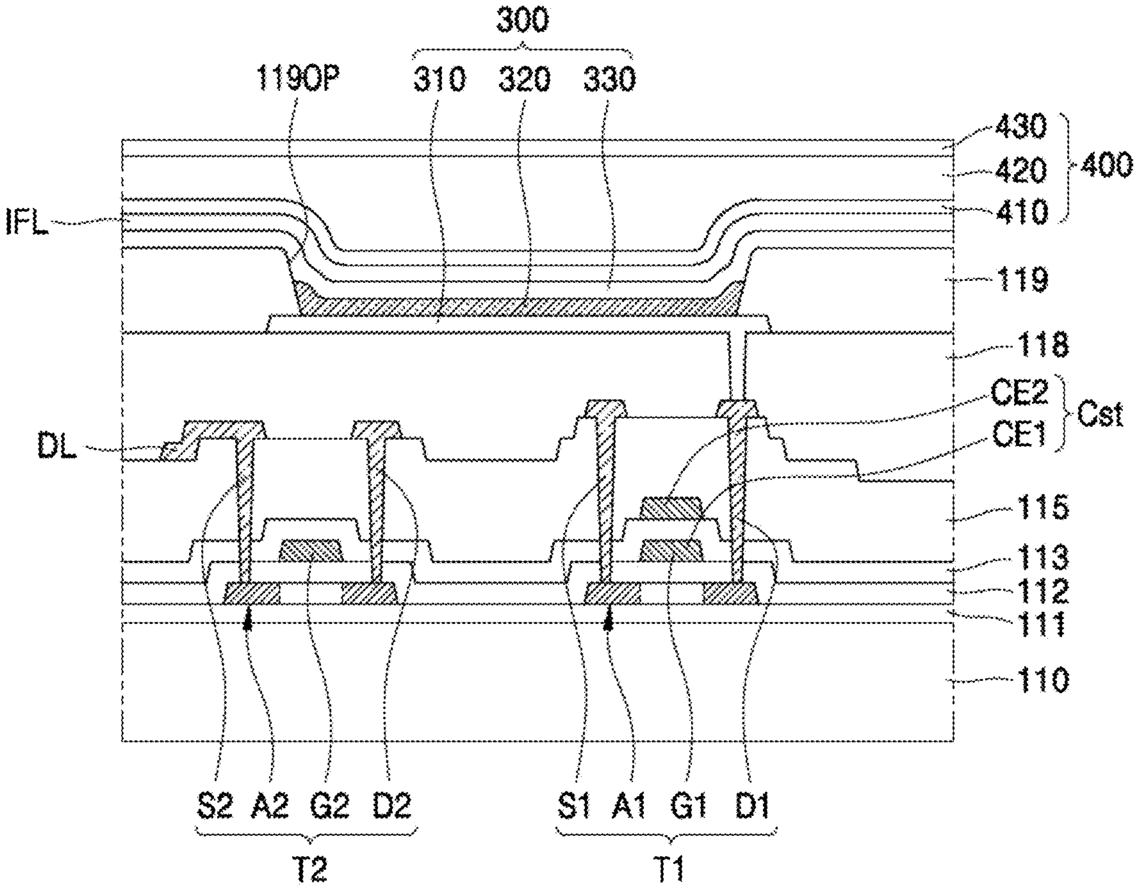

Referring to FIG. 14, the method of manufacturing the display device according to an embodiment may further include forming the thin-film encapsulation layer 400 on the inorganic functional layer IFL. The forming of the thin-film encapsulation layer 400 may be performed in an order of the first inorganic encapsulation layer 410, the organic encapsulation layer 420, and the second inorganic encapsulation layer 430. The first inorganic encapsulation layer 410 may be in contact with the upper surface of the inorganic functional layer IFL.

According to the one or more embodiments described above, a display device with improved emission performance and a method of manufacturing the display device may be implemented. However, the scope of the disclosure may not be limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:

a display element disposed on a substrate and including a pixel electrode, an emission layer, and an opposite electrode;

an inorganic functional layer disposed on the opposite electrode and including a first element; and a thin-film encapsulation layer disposed on the inorganic functional layer, wherein the inorganic functional layer includes at least one first film and at least one second film disposed on the at least one first film, in each of the at least one first film and the at least one second film, a stoichiometric ratio of the first element decreases as distance from the substrate increases, and the first element is selected from a group consisting of silicon (Si), titanium (Ti), aluminum (Al), hafnium (Hf), indium (In), tin (Sn), chromium (Cr), manganese (Mn), iron (Fe), tantalum (Ta), zinc (Zn), and a combination thereof.

2. The display device of claim 1, wherein the at least one first film and the at least one second film have different refractive indices from each other.

3. The display device of claim 1, wherein a thickness of the inorganic functional layer is greater than or equal to about 10 Å and less than or equal to about 2000 Å.

4. The display device of claim 1, wherein thickness uniformity of the inorganic functional layer is greater than about 0% and less than or equal to about 2%.

5. The display device of claim 1, wherein the inorganic functional layer comprises a nitride, an oxide, an oxynitride, or a combination thereof of the first element.

6. The display device of claim 1, wherein the at least one first film includes a plurality of first films, the at least one second film includes a plurality of second films, and the plurality of first films and the plurality of second films are alternately disposed on each other.

7. The display device of claim 1, further comprising:

an organic functional layer in contact with at least one of an upper surface and a lower surface of the inorganic functional layer.

8. The display device of claim 1, wherein the thin-film encapsulation layer comprises a first inorganic encapsulation layer, an organic encapsulation layer, and a second inorganic encapsulation layer, and the first inorganic encapsulation layer is in contact with the inorganic functional layer.

9. The display device of claim 1, further comprising:

a pixel-defining layer exposing a part of the pixel electrode.

* * * * *